United States Patent [19]

Wu

[11] Patent Number: 6,033,956
[45] Date of Patent: Mar. 7, 2000

[54] METHOD TO FORM CONTACTLESS ARRAY FOR HIGH DENSITY NONVOLATILE MEMORIES

[75] Inventor: Shye-Lin Wu, Hsinchu, Taiwan

[73] Assignee: Powerchip Semiconductor Corp., Hsinchu, Taiwan

[21] Appl. No.: 08/935,544

[22] Filed: Sep. 23, 1997

[30] Foreign Application Priority Data

Mar. 27, 1997 [TW] Taiwan ................................ 86103965

[51] Int. Cl.⁷ .............................................. H01L 21/8247
[52] U.S. Cl. ............................................ 438/261; 438/263
[58] Field of Search ................................ 438/261, 263, 438/264, 278, 296, 424, 787, 591

[56] References Cited

U.S. PATENT DOCUMENTS

| | | | |
|---|---|---|---|
| 4,720,323 | 1/1988 | Sato | 438/591 |
| 5,472,898 | 12/1995 | Hong et al. | 438/278 |
| 5,523,251 | 6/1996 | Hong | 438/278 |
| 5,693,551 | 12/1997 | Su et al. | 438/278 |
| 5,770,501 | 6/1998 | Hong | 438/264 |

*Primary Examiner*—Chandra Chaudhari
*Attorney, Agent, or Firm*—Finnegan, Henderson, Farabow, Garrett & Dunner, L.L.P.

[57] ABSTRACT

A method of forming contactless array for high density ROM. After floating gates and $N^+$ buried bit lines are formed, LPD oxide is deposited over the $N^+$ buried bit lines. Then, a thin oxide layer and a thin nitride layer are successively grown on the floating gates. Moreover, another oxidation process is performed to reoxidize the thin nitride film to become an oxynitride film. Next, a second $N^+$ polysilicon layer is deposited to form control gates.

7 Claims, 5 Drawing Sheets

METHOD TO FORM CONTACTLESS ARRAY FOR HIGH DENSITY NONVOLATILE MEMORIES

BACKGROUND OF THE INVENTION

1. Field of the Invention

The invention relates in general to the fabrication of semiconductor integrated circuits (ICs), and more particularly to a method to form a contactless array for high density nonvolatile memories.

2. Description of the Related Art

Traditionally, advances in the reduction of EPROM memories have concentrated on pushing the limits of optical lithography and plasma etching. The cell frequently used by the industry is the cell shown in FIG. 1. This cell uses locally oxidized silicon (LOCOS) to isolate individual bits. A half contact per cell is required to connect drain diffusions to the metal bit lines. Though the source/drain diffusions 100 are self-aligned to the polysilicon floating gates 102, optical registration is required to align the floating gate 102, word lines 104 and contacts to the field oxide.

A. T. Mitchell et.al. proposed a process which is used to construct a Floating gate Avalanche injection MOS (FAMOS) device which does not require the use of LOCOS isolation on contacts in the array. The cell is filly self-aligned and therefore does not place any alignment restrictions on conventional optical lithography. The cell is called SPEAR for Self-aligned Planar EPROM Array. Process steps for the fabrication of SPEAR FAMOS are depicted through FIG. 2A to 2D. Two adjacent transistors are shown in these pictures to indicate how the process would be used in an array formation. Referring to FIG. 2A, samples are fabricated on, for example, 12 ohm-cm <100> silicon substrates 200. Conventional LOCOS isolation is used to isolate peripheral devices, but is not used in the formation of the SPEAR cell. After field isolation, an array implant is performed through a dummy oxide to set the FAMOS threshold voltage. The FAMOS gate oxide 202, having a thickness of about 350 Å, is then grown. A polysilicon layer 204 is then deposited and defined, using a patterned photoresist layer 206 as a mask, to form long continuous polysilicon slots 205. The width of the polysilicon slots 205 also defines the length of the FAMOS transistor. Next, arsenic is implanted in the polysilicon slots 205 forming the buried $N^+$ bit lines 208 and also acting as the source and drain for the FAMOS transistor. Referring then to FIG. 2B, a conformal CVD TEOS (tetraethyl orthosilicate) oxide 210 is deposited to fill in the slots 205 and a planarizing photoresist 212 is spun on the wafer. A second resist coat and pattern, applied after the planarization resist coating, was then used to protect the periphery region by opening only the array area. As shown in FIG. 2C, a planarizing plasma etch that etches both the oxide layer 210 and the photoresist layers 212 at the same rate is used to remove the TEOS oxide 210 over the polysilicon slots 205, thus exposing the surface of the polysilicon layer 204 yet leaving oxide in the slots 205 over the buried bit lines 208. The planarization process is called oxide Resist-Etch-Back (REB). Referring to FIG. 2D, interlevel dielectric layer 214 with an effective oxide thickness of 350 Å (consisting of interlevel oxide and interlevel nitride) and a polysilicon layer 216 are then deposited. The polysilicon layer 216, interpoly dielectric layer 214 and polysilicon layer 204 are all etched to complete the formation of the polysilicon floating gate and to form the polysilicon word lines.

top view of the conventional cross-point EPROM cell proposed by A. T. Mitchell et.al. is shown in FIG. 3, drawn with a proposed 1 μm design rule, wherein the reference number 301, 302 and 303 represent the word line 301, bit line 302 and floating gate 303, respectively. Comparing the SPEAR cell proposed by A. T. Mitchell with the industry standard cell shown in FIG. 1, it is found that the SPEAR cell is less than half the size of the industry standard cell.

However, during the process of manufacturing such a SPEAR cell the REB process used to planarize the interlevel oxide between poly 1 lines in the array which creates plasma-induced damage and plasma-process-induced particle contamination. Plasma consists of energized ions, electrons, and excited molecules. When the excited particles recombine, they give off photons having an energy of a few eV. In addition, ion and electron bombardment may all contribute to damage mechanisms. Plasma-induced damage can take many forms, such as a trapped interface charge, and material defects migration into bulk materials. Moreover, plasma processes can generate a large number of particles on the wafer surface during etching. These particles range in size from less than a quarter of a micrometer to tens of micrometers at a density of over $10^7$ cm$^{-3}$, and they can fall on the wafer surface when the plasma in turned off

SUMMARY OF THE INVENTION

It is therefore an object of the invention to provide a process for forming contactless array for high density ROM. After floating gates and $N^+$ buried bit lines are formed, LPD oxide is deposited over the $N^+$ buried bit lines. Then, a thin oxide layer and a thin nitride layer are successively grown on the floating gates. Moreover, another oxidation process is performed to reoxidize the thin nitride film to become an oxynitride film. Next, a second $N^+$ polysilicon layer is deposited to form control gates.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
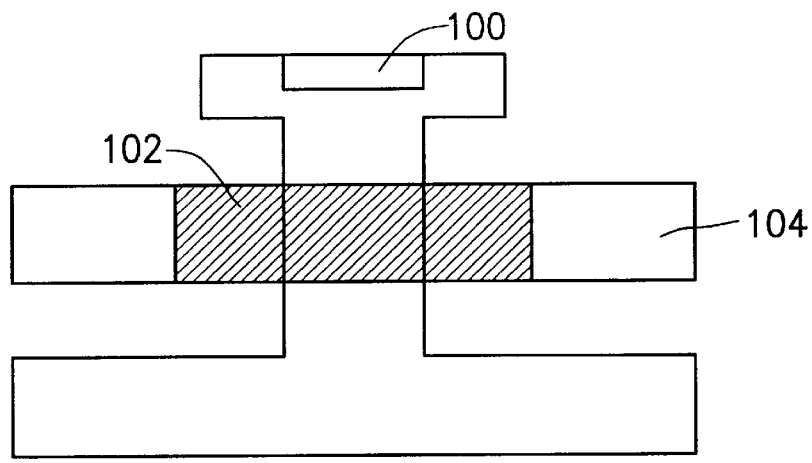
FIG. 1 (prior art) is a top view of a conventional industry standard EPROM cell.
Figure 2A:
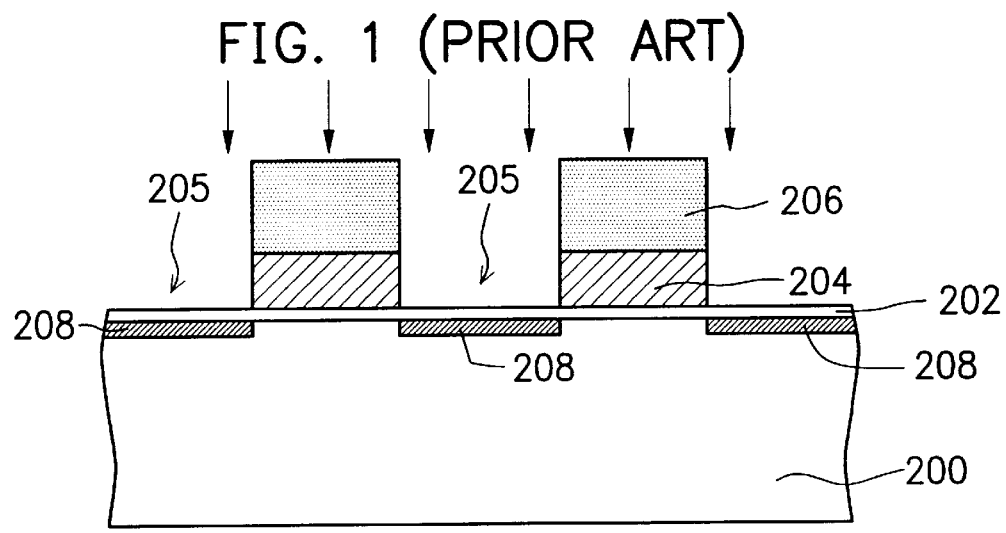
FIGS. 2A to 2D (prior art) are cross-sectional views showing a conventional process of fabricating a SPEAR FAMOS cell proposed by A. T. Mitchell et.al.
Figure 2B:
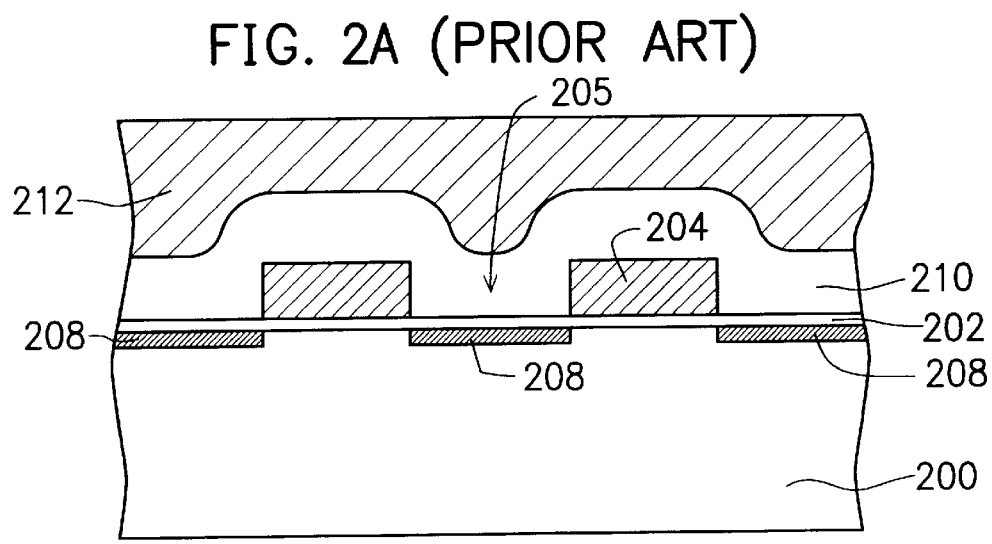
Figure 2C:
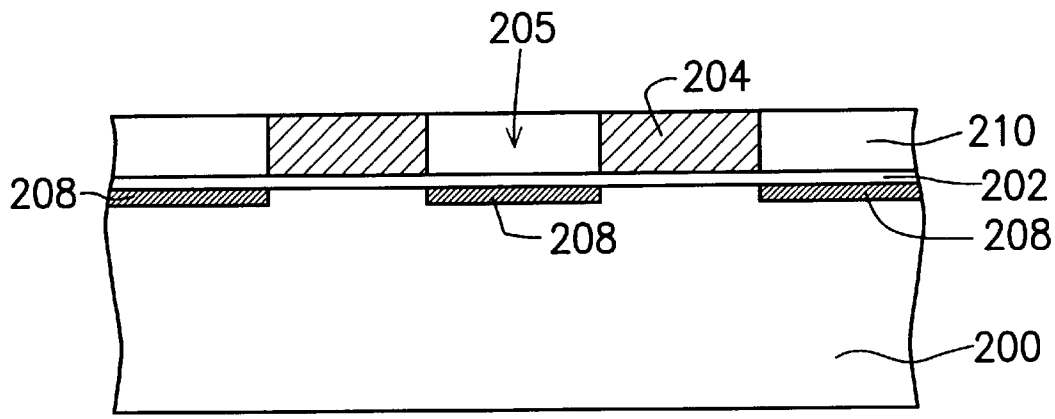
Figure 2D:
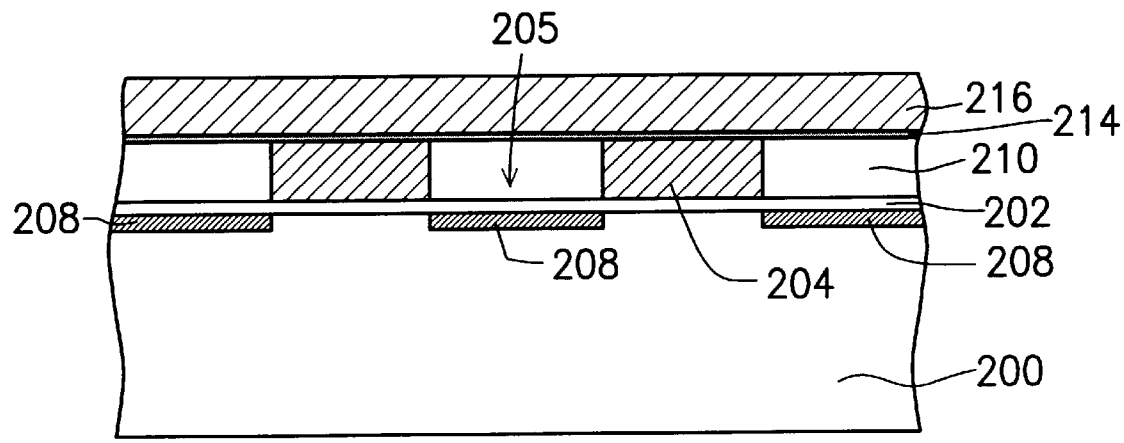
Figure 3:
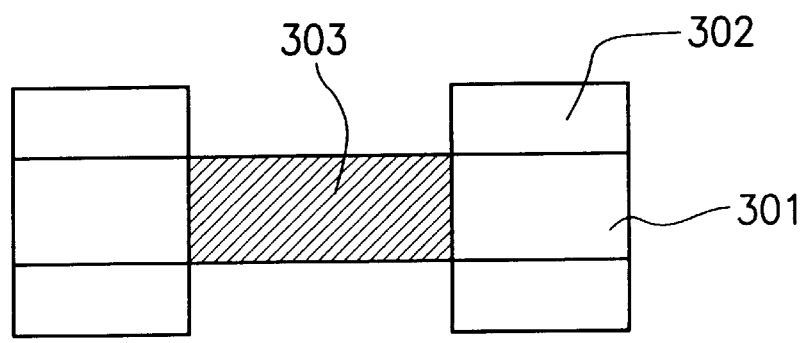
FIG. 3 is a top view of a cross-point EPROM cell according to a preferred embodiment of the invention.
Figure 4A:
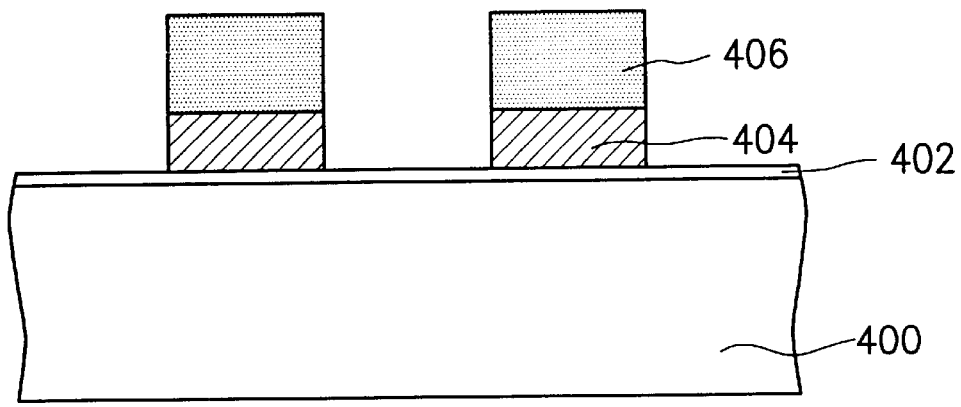
FIG. 4A to 4G are cross-sectional views showing the process steps of fabricating contactless arrays of an EPROM according to a preferred embodiment of the invention.
Figure 4B:
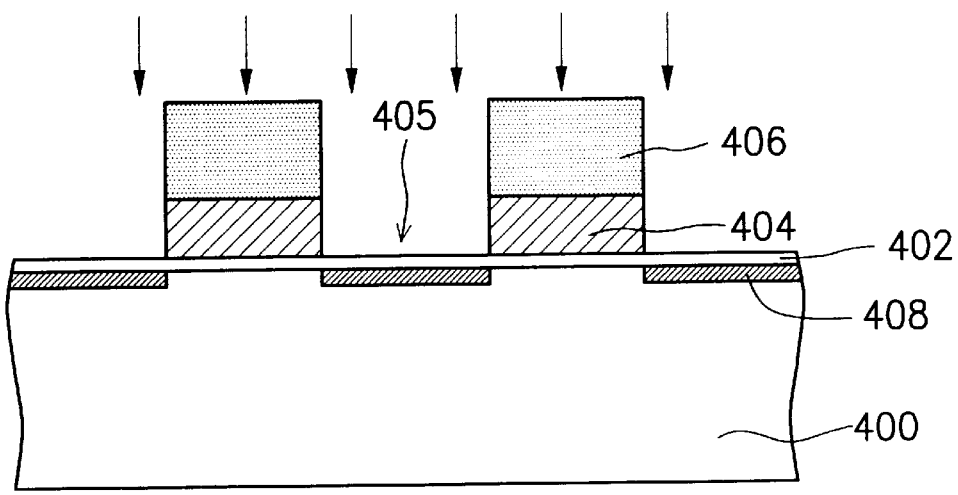

Process steps for the fabrication of SPEAR FAMOS according to the invention are depicted through FIG. 4A to FIG. 4G. Two adjacent transistors are shown in these pictures to indicate how the process would be used in an array formation. Referring to FIG. 4A, samples are fabricated on, for example, 12 ohm-cm <100> silicon substrates 400. Conventional LOCOS isolation is used to isolate peripheral devices, but is not used in the formation of the SPEAR cell. After field isolation, an array implant is performed (not shown) through a dummy oxide to set the FAMOS threshold voltage. The FAMOS gate oxide 402, having a thickness of about 200 Å~500 Å, is then grown. A polysilicon layer 404 is then deposited and defined, using a patterned photoresist layer 406 as a mask, to form long continuous polysilicon slots 405. Next, referring to FIG. 4B, arsenic is implanted into the silicon substrate 400 to form buried N⁺ bit lines 408 and also acting as the source and drain for the FAMOS transistor. At this point, standard techniques for siliciding the bit lines could easily be applied. However, any modification of the siliciding technique does not limit the scope the invention.

Figure 4C:
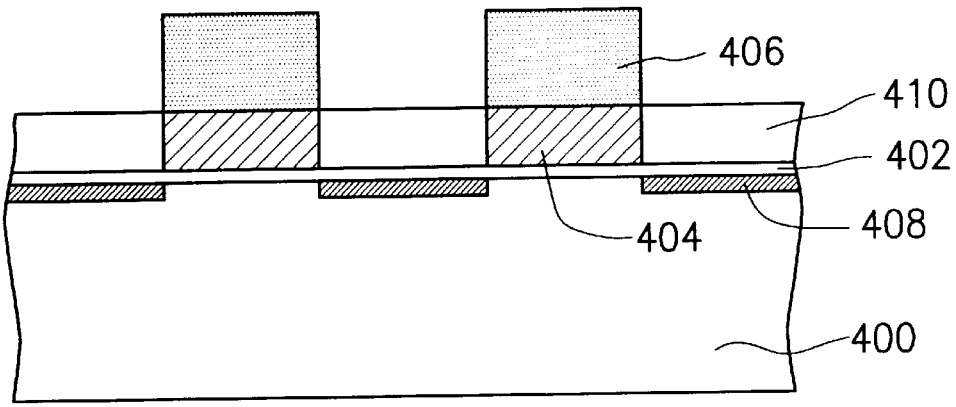

Referring then to FIG. 4C, a liquid-phase deposition (LPD) technique is employed to selectively form LPD oxide 410 on the exposed surface of the gate oxide layer 402, utilizing supersaturated hydrofluosilicic acid ($H_2SiF_6$) aqueous solution as a source liquid.

Figure 4D:
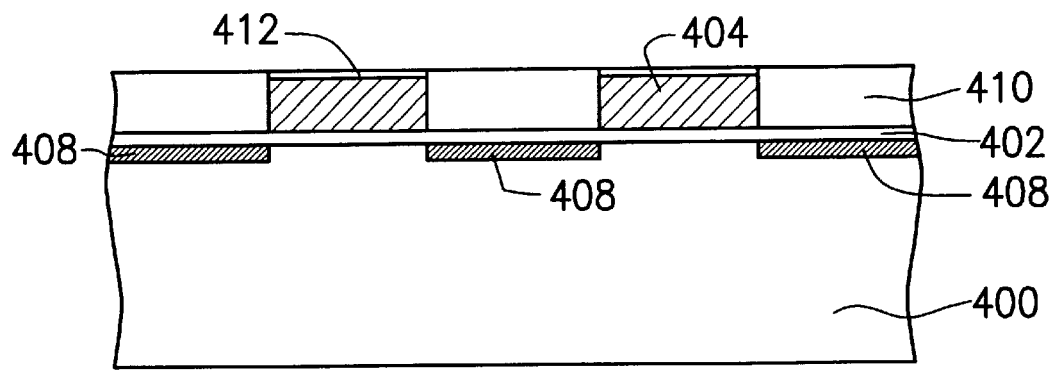
Figure 4E:
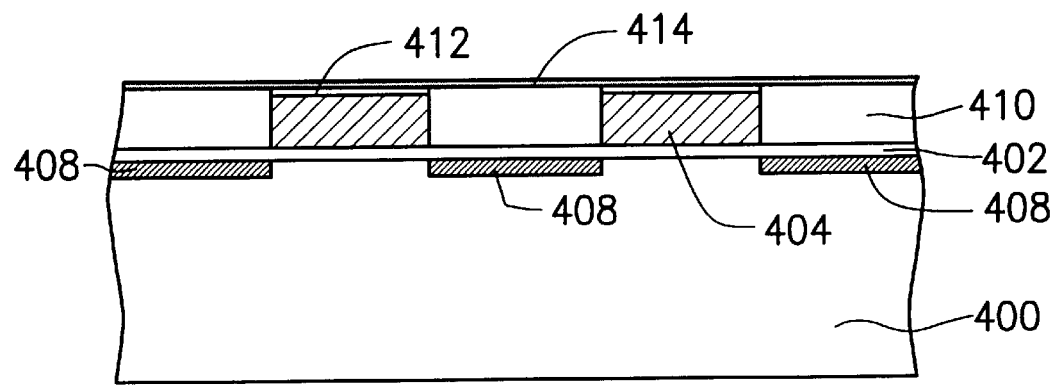
Figure 4F:
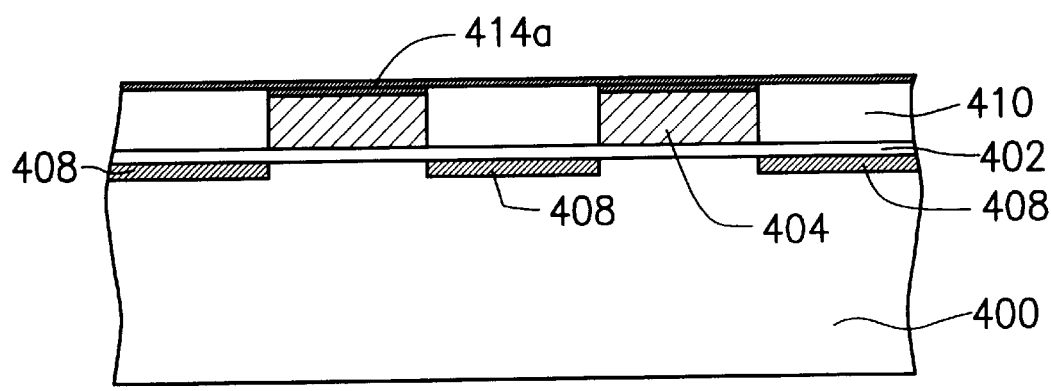

Referring to FIG. 4D, a thin oxide layer 412 is formed at least on the upper surface of the polysilicon 404, using, for example, chemical vapor deposition (CVD). The photoresist layer 406 is by now removed using, for example, $O_2$ plasma etching. As shown in FIG. 4E, a thin nitride layer 414 is deposited, preferably using chemical vapor deposition, over the LPD oxide 410 and the thin oxide layer 412. Then, referring to FIG. 4F, the thin nitride layer 414 is oxidized in low temperature steam to form an oxynitride layer 414a, which simultaneously condenses the LPD oxide 410. Alternatively, another thin oxide layer can be deposited over the thin nitride layer 414 to form a stacked oxide/nitride/oxide dielectric layer. The thin oxide layer 412 and the oxynitiride layer 414a together form a dielectric layer between the floating gate and the control gate. In addition, any single or composite dielectric layer having equivalent effect can be employed. Therefore, any modification of the dielectric layer will not limit the scope of the invention.

Figure 4G:
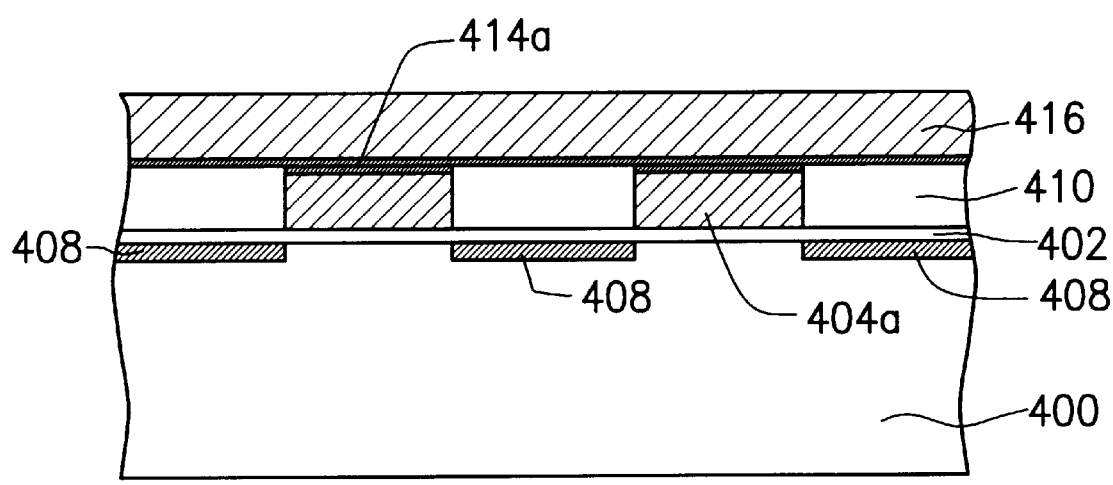

Referring now to FIG. 4G, a polysilicon layer 416 is deposited over the oxynitride layer 414a. The polysilicon layer 416 can be N⁺ doped and etched together with the oxynitride layer 414a and the thin oxide layer 412 to form the word lines. Simultaneously, the polysilicon 404 are etched to form individual floating gates 404a. Standard processing techniques are then used to complete the peripheral devices. Since they are well known and not directly related to the scope of the invention, they are not described herein.

From the above-mentioned description of a preferred embodiment of the invention, it is therefore clear for the ones skilled in this art that the method of fabricating a SPEAR FAMOS according to the invention has the following advantages. The formation of the interlevel oxide between the N⁺ buried bit lines and the floating gates can be easily controlled to have the same level of the floating gate, by employing the LPD technique. Plasma-induced damage and plasma-process-induced particle contamination come with the REB process are therefore avoided. Also, the array density of nonvolatile memories can be significantly increased by the current photolithography technique.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming contactless arrays for high density nonvolatile memories, comprising the steps of:

(a) providing a silicon substrate wherein a plurality of polysilicon strips formed on said silicon substrate and a plurality of first oxide layers are formed at least between said polysilicon strips on said silicon substrate, said polysiliscon strips having a thickness;

(b) implanting ions into said silicon substrate through said first oxide layers to form a plurality of buried bit lines;

(c) performing a liquid-phase deposition (LPD) technique to form LPD oxide on said first oxide layers between the polysilicon strips, so that the LPD oxide has a thickness the same as the thickness of the polysiliscon strips;

(d) forming a dielectric layer on the LPD oxide and the polysiliscon strips, wherein the dielectric layer has an oxynitride layer, and while forming the dielectric layer, the LPD oxide layer is simultaneously condensed;

(e) forming a polysilicon layer on said dielectric layer; and (f) patterning said polysilicon layer and said polysilicon strips to form a plurality of word lines and a plurality of floating gates, respectively, wherein the step of forming a dielectric layer comprising the substeps of:

forming a second oxide layer on the polysilicon strips;

after forming the second oxide layer, forming a nitride layer on the second oxide layer and the LPD oxide; and oxidizing the nitride layer and simultaneously condensing the LPD oxide, wherein the nitride layer is transformed into an oxynitride layer, and the dielectric layer is formed of the second oxide layer and the oxynitride layer.

2. A method as claimed in claim 1, wherein said floating gates are N⁺ doped.

3. A method as claimed in claim 1, wherein said first oxide layer has a thickness of about 200–500 Å.

4. A method as claimed in claim 1, wherein in said step (b), arsenic is implanted into said silicon substrate to form said N⁺ doped buried bit lines.

5. A method as claimed in claim 1, wherein the LPD is performed to form LPD oxide by utilizing supersaturated hydrofluosilicic acid ($H_2SiF_6$) aqueous solution as source liquid.

6. A method as claimed in claim 1, wherein in said step (e), said polysilicon layer is N⁺ doped.

7. A method of forming contactless arrays for high density nonvolatile memories, comprising the steps of:

(a) providing a silicon substrate, a plurality of polysilicon strips formed on said silicon substrate, and a plurality of first oxide layers formed at least between said polysilicon strips on said silicon substrate, said polysiliscon strips having a thickness;

(b) implanting ions into said silicon substrate through said first oxide layers to form a plurality of buried bit lines;

(c) performing a liquid-phase deposition (LPD) to form LPD oxide on said first oxide layers between the polysilicon strips, so that the LPD oxide has a thickness the same as the thickness of the polysilicon strips;

(d) forming a dielectric layer on the LPD oxide and the polysilicon strips, wherein the dielectric layer has an oxynitride layer, and while forming the dielectric layer, the LPD oxide layer is simultaneously condensed;

(e) forming a polysilicon layer on said dielectric layer; and (f) patterning said polysilicon layer and said polysilicon strips to form a plurality of word lines and a plurality of floating gates, respectively, wherein the step of forming a dielectric layer comprising the substeps of:

forming a second oxide layer on the polysilicon strips;

after forming the second oxide layer, forming a nitride layer on the second oxide layer and the LPD oxide;

oxidizing the nitride layer and simultaneously condensing the LPD oxide, wherein the nitride layer is transformed into an oxynitride layer; and forming a third oxide layer on the oxynitride layer, wherein the dielectric layer is formed of the second oxide layer, the oxynitride layer, and the third oxide layer.

* * * * *